(12) United States Patent
Sung

(10) Patent No.: US 6,392,332 B1
(45) Date of Patent: May 21, 2002

(54) LAMINATED PIEZO CERAMIC TRANSFORMER DEVICE

(76) Inventor: Kuan Kuan Sung, 10788-165th Street, Surrey, B.C. (CA), V4N 3M1

( * ) Notice: Subject to any disclaimer, the term of this patent is extended or adjusted under 35 U.S.C. 154(b) by 0 days.

(21) Appl. No.: 10/001,181

(22) Filed: Dec. 4, 2001

(51) Int. Cl.$^7$ .................. H01L 41/107; H01L 41/083; H01L 41/047

(52) U.S. Cl. ........................................ 310/359; 310/366

(58) Field of Search .................................. 310/359, 366

(56) References Cited

U.S. PATENT DOCUMENTS

| | | | | |
|---|---|---|---|---|
| 6,078,127 A | * | 6/2000 | Saito et al. | 310/359 |
| 6,172,447 B1 | * | 1/2001 | Ishikawa et al. | 310/359 |
| 2001/0026113 A1 | * | 10/2001 | Watanabe et al. | 310/359 |
| 2001/0040420 A1 | * | 11/2001 | Watanabe et al. | 310/311 |

FOREIGN PATENT DOCUMENTS

JP 9-69657 * 3/1997 .......... H01L/41/107

* cited by examiner

Primary Examiner—Thomas M. Dougherty

(57) ABSTRACT

An improved structure of a laminated piezo ceramic transformer device comprising multiple thin square piezo ceramic plate, mesh-printing with electrode material in three different patterns, a circular internal electrode, a circular solid and or dotted line supporting structure and a connecting electrode. This improved structure has better plate support and even thickness to reduce known green body crack while laminating plate and reduce sintered parts micro-crack. Since expensive electrode material will accelerate ceramic crystallization resulting a lower sintering temperature and lower production cost, the circular solid and or dotted line supporting structure will maximize electrode material coverage but with less amount. In addition, applying a thin layer of bond, glue or paint to the piezo ceramic transformer will reduce insulation degradation caused by high moisture, avoid electrode oxidation and reduce noise level caused by inherent mechanical vibration. These improved structure and process provide a better yield rate, lower production cost and broader mobile application.

8 Claims, 5 Drawing Sheets

FIG.3A
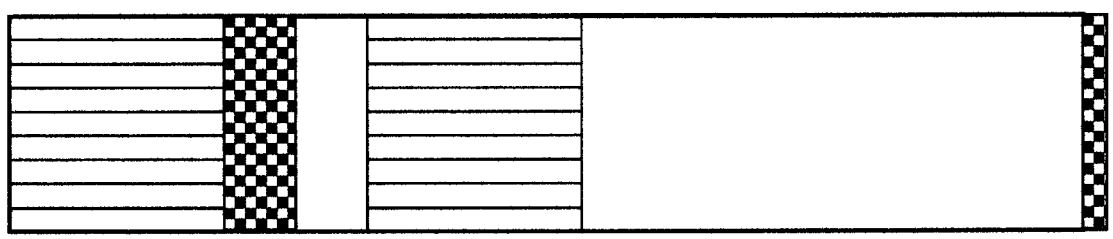
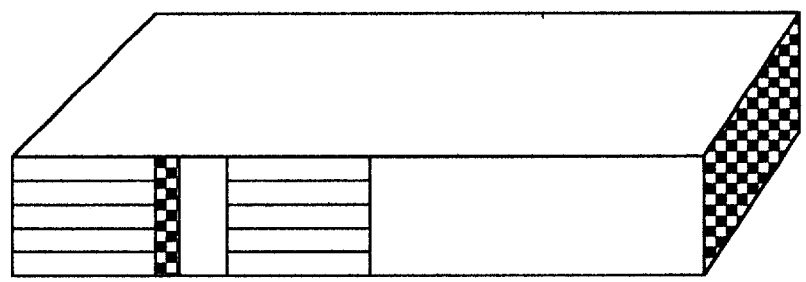
FIG.3B

LAMINATED PIEZO CERAMIC TRANSFORMER DEVICE

CROSS REFERENCE TO RELATED APPLICATION

| U.S. PATENT DOCUMENTS | | | |
|---|---|---|---|
| 5,929,554 | Jul. 1999 | Kanayama et al. | 310/359 |
| 5,962,954 | Oct. 1999 | Leers et al. | 310/359 |
| 6,278,226 | Aug. 2001 | Henry et al. | 310/359 |
| FOREIGN PATENT DOCUMENTS | | | |
| 11-004025 | June 1999 | Makino Hiroaki | Japan |
| 2000-226750 | Jul. 2000 | Kataoka Takushi | Japan |
| 2000-353833 | Dec. 2000 | Inoue Takeshi | Japan |

BACKGROUND OF THE INVENTION

1. Field of the Invention

The present invention relates to an improved structure of laminated piezo ceramic transformer device, wherein the internal electrode is circular and surround by a circular solid and or dotted line supporting structure to prevent internal crack, a protection coating is apply to the outside of the device to reduce noise level and prevent oxidation and insulation degradation.

2. Description of the Prior Art

The piezo ceramic transformer was first developed in early 1960s based on U.S. Pat. No. 2,974,296. It has many advantages compared to conventional magnetic transformer: low profile, high efficiency, less EMI, unique dependence of step-up ratio on load impedence etc. These advantages match perfectly with recent mobile communication and LCD display needs, more specifically, as a step-up transformer in inverter circuit for CCFL backlight unit.

Many variation and improvement were developed and disclosed in U.S. Pat. Nos. 5,929,554, 5,962,9546 and 278,226 and Japan Pat. No. 11-004025, 2000-226750 and 2000-353833. The original Rosen type design use rectangular laminating piezoelectric transformer which operates in the length longitudinal-oscillation mode by which the laminating was carried out in the thickness orientation. Recent improvement use near square or square type with internal electrode, which operates by the diameter breadth oscillation mode and has achieved higher electromechanical coupling coefficient.

FIG. 1A, FIG. 1B, FIG. 1C and FIG. 1D is top view of single layer piezo ceramic plate of a conventional laminated piezo ceramic transformer, wherein single layer piezo ceramic plate 1 has mesh-printed internal electrode 10 and four connecting electrodes 11, 12, 13 and 14 connect to four different outer electrodes. Internal electrode material is silver paste or other precious metal alloy paste.

FIG. 1E is cross sectional view of conventional laminated piezo ceramic transformer green body, produced by laminating multiple layers of piezo ceramic plate as shown in FIG. 1A, FIG. 1B, FIG. 1C and FIG. 1D. Since only central circular area of piezo ceramic plate has internal electrode printed while outer rim area was not printed to avoid short-circuit or insulation problem, thickness is higher in central area than outer rim. When laminating multiple layers of piezo ceramic plate and applying pressure to form conventional piezo ceramic transformer green body, plate broken or crack is easily introduced, this problem is getting worse when piezo ceramic plate is thinner, internal electrode is thicker or more laminated layer is required.

In addition, above laminated piezo ceramic transformer green body require numerous post processing work, like debinding, sintering, grinding, outer electrode soldering etc. Above-mentioned thickness difference will introduce much higher stress at the center of piezo ceramic plate during post processing.

In addition, since internal electrode will accelerate ceramic crystallization or crystal growth, crystal growth rate and crystal boundary shrinkage rate between central and outer rim area of piezo ceramic plate is different. All these will add up producing crack 22 or micro crack 23 during post processing and significantly reduce yield rate. FIG. 1F, FIG. 1G and FIG. 1H are bottom, top and side view of conventional laminated piezo ceramic transformer with crack and micro crack after post processing.

SUMMARY OF INVENTION

Accordingly, the object of the present invention is to provide an improved structure of laminated piezo ceramic transformer, mesh-printed with circular solid and or dotted line supporting structure to effectively improve broken or crack introduced by known thickness difference during laminating and post processing work.

Another object of present invention is to provide an improved structure of laminated piezo ceramic transformer, by maximizing electrode material coverage on piezo ceramic plate to accelerate crystal growth rate with lower sintering temperature and lower production cost.

In order to achieve above objectives, the present invention provide an improved structure comprising multiple thin square piezo ceramic plate, mesh-printing with electrode material in three different patterns, a circular internal electrode, a circular solid and or dotted line supporting structure and a connecting electrode. Thin piezo ceramic plate use easy to produce square shape. Circular internal electrode is mesh printed with silver or alloy paste and polarized to present diameter breadth oscillation mode. Connecting electrode is at the outer rim of circular internal electrode, which connect circular internal electrode to outer electrode soldered to post-processed laminated piezo ceramic transformer. Connecting electrode can point to any one of four directions, i.e. first, second, third and fourth direction perpendicular to the edge of piezo ceramic plate. Circular solid and or dotted line supporting structure is mesh printed with same silver or alloy paste and locate at the outer rim of circular internal electrode, excluding connecting electrode area.

Multiple layers of thin piezo ceramic plate with mesh-printed circular internal electrode, connecting electrode and circular solid and or dotted line supporting structure are laminated using first and second or third and fourth direction sequence to produce the laminated piezo ceramic transformer green body in the implementation example. The green body is post-processed with debinding, sintering and grinding then apply outer electrode at four sides connecting internal electrode to produce a finished laminated piezo ceramic transformer 4.

Since electrode material is easy to oxidize, especially when voltage is applied and in high humidity environment, such electrode oxidization will cause insulation degradation. The present invention applies a soft protection coating to prevent high humidity insulation degradation problem in the implementation example. The protection coating can be bond, glue or paint and the protection coating can apply to various laminated piezoelectric devices as shown in FIG. 3A and FIG. 3B.

The present invention and implementation example use thin piezo ceramic plate mesh-printed with circular internal electrode and circular solid and or dotted line supporting structure to prevent uneven plate thickness problem in conventional laminated piezo ceramic transformer and solved known green body plate broken and crack problem.

Since electrode material will accelerate ceramic crystallization or crystal growth, crystal growth rate and shrinkage rate between electrode covered area and uncvered area will be different, this will create uneven and over stress when debinding, sintering and grinding and produce crack or micro crack.

The present invention and implementation example has maximize electrode coverage area on piezo ceramic plate by using solid and or dotted line supporting structure mesh-printed with same electrode material, it not only solved uneven and over stress problem known to conventional laminated piezo ceramic transformer but also reduce sintering temperature as a result of higher crystal growth rate.

The above and other objects, feature and advantages of the present invention will become clear from the following description based upon the accompanying drawings, which illustrate examples of preferred embodiment of the present invention.

BRIEF DESCRIPTION OF THE DRAWINGS

FIG. 3A is side view of Rosen type laminated piezo ceramic transformer with protection coating.

FIG. 3B is three-dimensional view of Rosen type laminated piezo ceramic transformer with protection coating.

DETAILED DESCRIPTION OF THE PREFERRED EMBODIMENT

FIG. 2A, FIG. 2B, FIG. 2C and FIG. 2D are top view of single layer piezo ceramic plate of present invention and implementation example, showing circular internal electrode and circular solid and or dotted line supporting structure and connecting electrode. Thin piezo ceramic plate use easy to produce square shape. Circular internal electrode is mesh printed with silver or alloy paste and polarized to present diameter breadth oscillation mode. Connecting electrode is at the outer rim of circular internal electrode, which connect circular internal electrode to outer electrode soldered to post-processed laminated piezo ceramic transformer. Circular solid and or dotted line supporting structure is mesh printed with same silver or alloy paste and locate at the outer rim of circular internal electrode, excluding connecting electrode area.

Figure 1A:
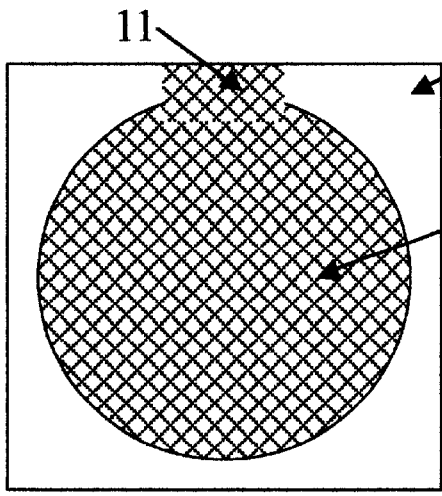
FIG. 1A, FIG. 1B, FIG. 1C and FIG. 1D are top view of single layer piezo ceramic plate of a conventional laminated piezo ceramic transformer, showing internal electrode and connecting electrode.
Figure 1B:
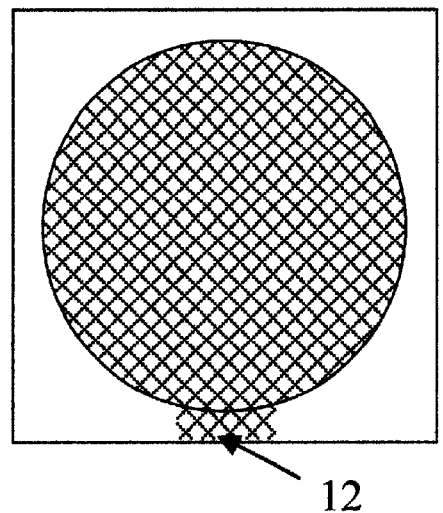
Figure 1C:
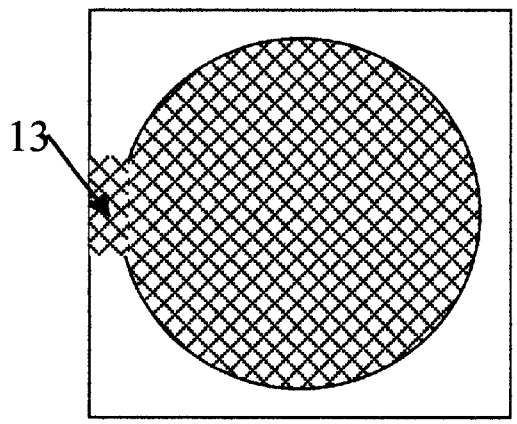
Figure 1D:
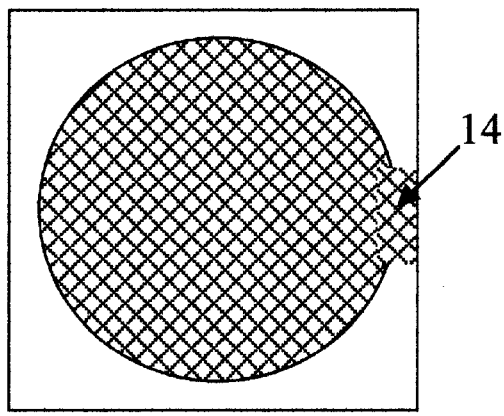
Figure 1E:
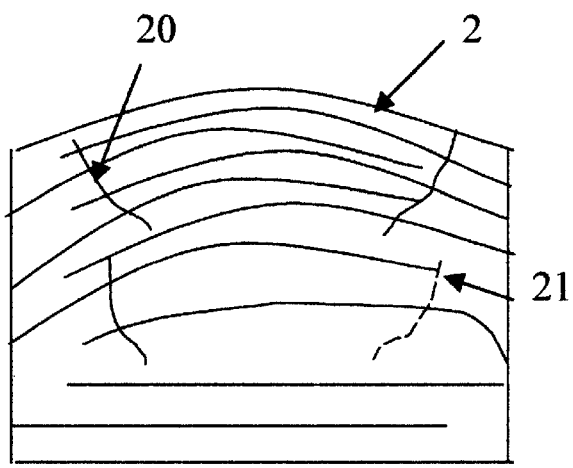
FIG. 1E is cross sectional view of conventional laminated piezo ceramic transformer green body, showing plate broken or crack.
Figure 1F:
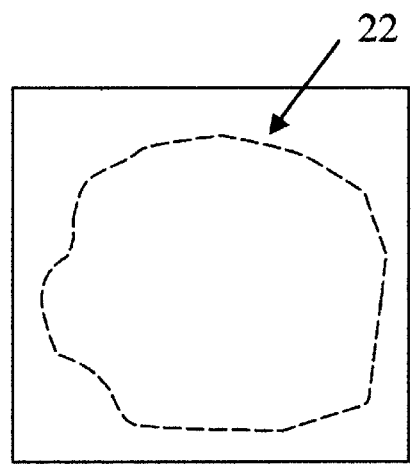
FIG. 1F is bottom view of post-processed conventional laminated piezo ceramic transformer, showing plate broken along outer rim of internal electrode area.
Figure 1G:
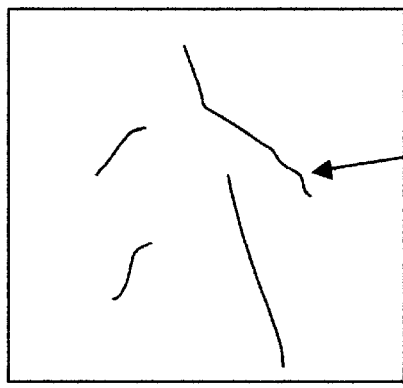
FIG. 1G is top view of post-processed conventional laminated piezo ceramic transformer, showing crack.
Figure 1H:
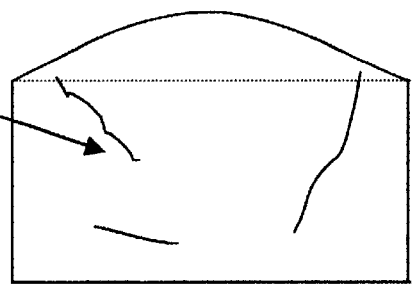
FIG. 1H is cross sectional view of post-processed conventional laminated piezo ceramic transformer, showing micro crack.
Figure 2A:
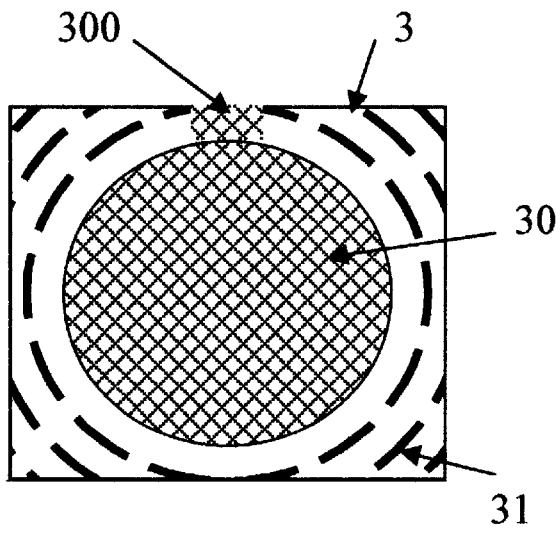
FIG. 2A, FIG. 2B, FIG. 2C and FIG. 2D are top view of single layer piezo ceramic plate of present invention, showing circular internal electrode, circular solid and or dotted line supporting structure and connecting electrode.
Figure 2B:
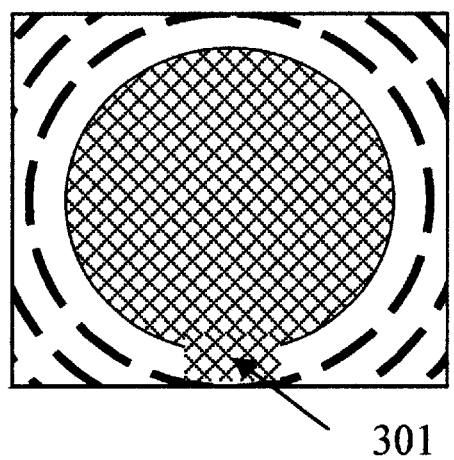
Figure 2C:
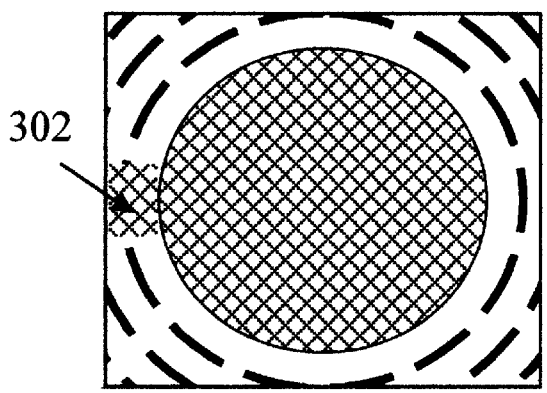
Figure 2D:
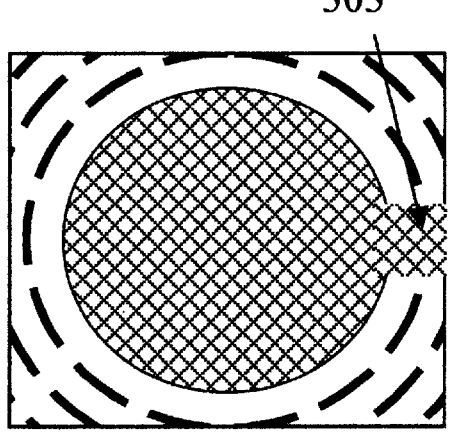
Figure 2E:
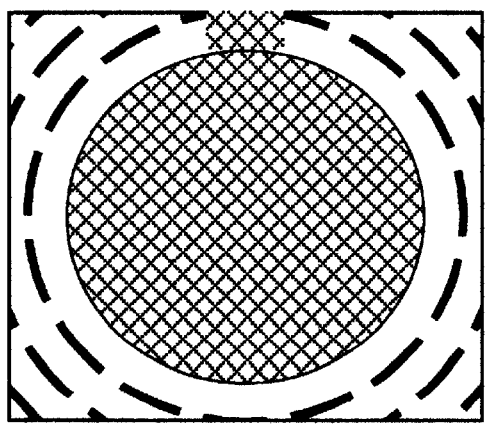
FIG. 2E is cross sectional view of present invention, showing an improved structure laminated piezo ceramic transformer green body.
Figure 2F:
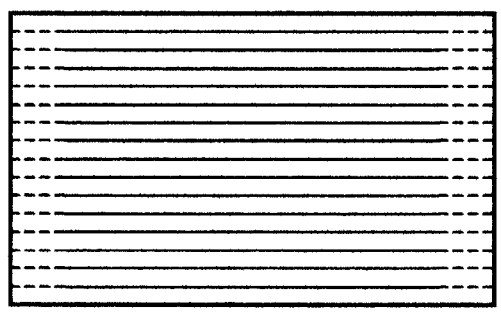
FIG. 2F is side view of present invention, showing an improved structure laminated piezo ceramic transformer with outer electrode soldered.
Figure 2F:
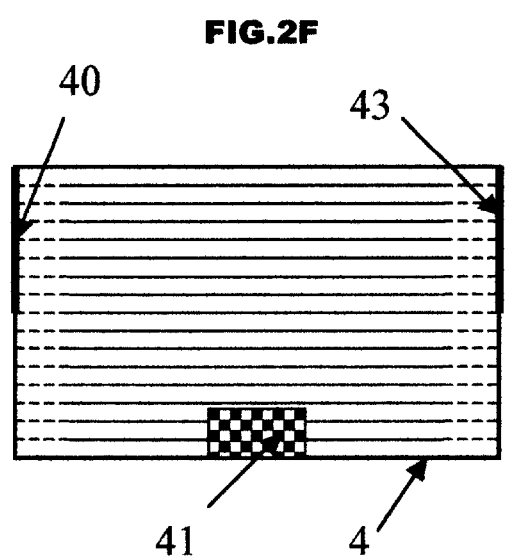
Figure 2G:
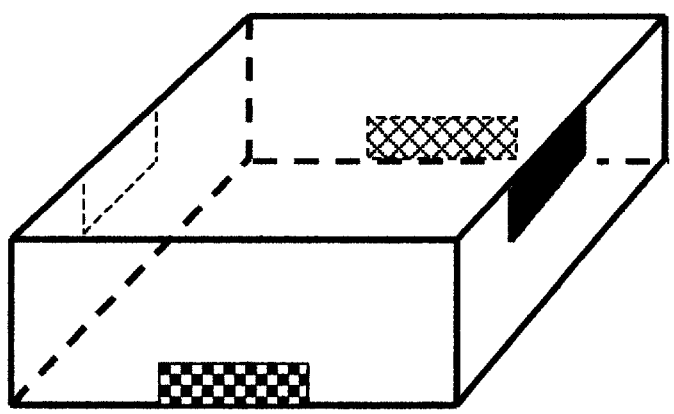
FIG. 2G is three-dimensional view of present invention

FIG. 2E is cross sectional view of present invention and implementation example, showing an improved structure laminated piezo ceramic transformer green body. Refer FIG. 2A to FIG. 2D and FIG. 2E to FIG. 2G, multiple layers of thin piezo ceramic plate with mesh-printed circular internal electrode, connecting electrode and circular solid and or dotted line supporting structure are laminated using first and second or third and fourth direction sequence to produce the laminated piezo ceramic transformer green body in the implementation example. The green body is post-processed with debinding, sintering and grinding then apply outer electrode 40, 41, 42 and 43 at four sides connecting internal electrode to produce a finished laminated piezo ceramic transformer 4.

Since electrode material is easy to oxidize, especially when voltage is applied and in high humidity environment, such electrode oxidization will cause insulation degradation and render the piezo ceramic transformer useless. The present invention and implementation example applies a soft protection coating right after grinding process to prevent high humidity insulation degradation problem. The protection coating can be bond, glue or paint and the protection coating can also apply to various laminated piezoelectric devices.

The present invention and implementation example use thin piezo ceramic plate mesh-printed with circular internal electrode and circular solid and or dotted line supporting structure to prevent uneven plate thickness problem in conventional laminated piezo ceramic transformer and solved known green body plate broken and crack problem.

Since electrode material will accelerate ceramic crystallization or crystal growth, crystal growth rate and crystal boundary shrinkage rate between electrode covered area and uncovered area will be different, this will create uneven stress during debinding, sintering and grinding process and produce crack or micro crack.

The present invention and implementation example has maximize electrode coverage area on piezo ceramic plate by using solid and or dotted line supporting structure mesh-printed with same electrode material, it not only solved uneven stress problem known to conventional laminated piezo ceramic transformer but also reduce sintering temperature and production cost as a result of higher crystal growth rate. In addition, it also reduce electrode material consumption and material cost.

The invention has been described using foregoing preferred embodiments, However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A laminated piezo ceramic transformer device comprising:
- a square piezo ceramic plate 3 which is laminated into multi-layered structure wherein each layer is poled along the thickness direction with polarization in the neighboring layers opposite to each other, when external voltage is applied, said piezo ceramic plate will present diameter breadth oscillation property;
- a circular internal electrode 30 which is mesh-printed with electrode material on said piezo ceramic plate;
- a circular solid and or dotted line supporting structure 31 which is mesh-printed with said electrode material forming concentric supporting structure; and
- a connecting electrode 300, 301, 302, and 303 which is mesh-printed with said electrode material that provide direct connections between said internal circular electrode and external electrode in four different direction.

2. The laminated piezo ceramic transformer device as defined in claim 1, wherein the piezo ceramic plate 3 is square shape.

3. The laminated piezo ceramic transformer device as defined in claim 1, wherein the internal electrode 30 is circular shape.

4. The laminated piezo ceramic transformer device as defined in claim 1, wherein the supporting structure 31 is concentric circular solid and or dotted line structure.

5. The laminated piezo ceramic transformer device as defined in claim 1, wherein the connecting electrode 301, 302, 303 and 304 are perpendicular to each side of said piezo ceramic plate.

6. The laminated piezo ceramic transformer device as defined in claim 1, wherein the four outer electrodes 41, 42, 43 and 44 are at four sides of said laminated piezo ceramic transformer device 4.

7. The laminated piezo ceramic transformer device as defined in claim 1, wherein the outside of said laminated piezo ceramic transformer device has a thin protection coating.

8. The protection coating material as defined in claim 7 is bond, glue or paint.

* * * * *